United States Patent
Hsueh et al.

(10) Patent No.: US 9,269,567 B2
(45) Date of Patent: Feb. 23, 2016

(54) HIGH PRODUCTIVITY COMBINATORIAL PROCESSING USING PRESSURE-CONTROLLED ONE-WAY VALVES

(71) Applicant: Intermolecular Inc., San Jose, CA (US)

(72) Inventors: Chien-Lan Hsueh, Campbell, CA (US); Chen-An Chen, San Jose, CA (US); Tony P. Chiang, Campbell, CA (US); Martin Romero, San Jose, CA (US); James Tsung, Milpitas, CA (US)

(73) Assignee: Intermolecular, Inc., San Jose, CA (US)

( * ) Notice: Subject to any disclaimer, the term of this patent is extended or adjusted under 35 U.S.C. 154(b) by 176 days.

(21) Appl. No.: 14/109,622

(22) Filed: Dec. 17, 2013

(65) Prior Publication Data

US 2015/0170908 A1 Jun. 18, 2015

(51) Int. Cl.
*C23C 16/455* (2006.01)
*H01L 21/02* (2006.01)

(52) U.S. Cl.
CPC .... *H01L 21/02271* (2013.01); *C23C 16/45548* (2013.01); *C23C 16/45561* (2013.01); *C23C 16/45565* (2013.01); *C23C 16/45574* (2013.01)

(58) Field of Classification Search
CPC .................. C23C 16/45523; C23C 16/45525; C23C 16/455; C23C 16/45561; C23C 16/45574
See application file for complete search history.

(56) References Cited

U.S. PATENT DOCUMENTS

| | | |
|---|---|---|
| 6,161,311 A | 12/2000 | Doley |
| 2002/0006772 A1 | 1/2002 | Togawa |
| 2003/0224105 A1 | 12/2003 | Chondroudis et al. |
| 2004/0023302 A1 | 2/2004 | Archibald |
| 2004/0071888 A1 | 4/2004 | Chondroudis et al. |
| 2006/0222770 A1* | 10/2006 | Sarigiannis et al. ........ 427/248.1 |
| 2008/0056962 A1* | 3/2008 | Mulqueen ..................... 422/130 |
| 2008/0156769 A1* | 7/2008 | Weiner et al. ................... 216/59 |
| 2008/0210169 A1* | 9/2008 | Pozzetti et al. ............... 118/730 |
| 2009/0061083 A1* | 3/2009 | Chiang et al. .............. 427/248.1 |
| 2009/0223443 A1* | 9/2009 | Ode ................................. 118/50 |
| 2010/0221439 A1 | 9/2010 | Lambert |
| 2012/0115315 A1* | 5/2012 | Zheng .......................... 438/483 |

OTHER PUBLICATIONS

Swagelok brochure "Diaphragm Valves for Atomic Layer Deposition". Aug. 2014, pp. 1-8.*

* cited by examiner

*Primary Examiner* — Bret Chen

(57) ABSTRACT

Apparatus for high productivity combinatorial (HPC) processing of semiconductor substrates and HPC methods are described. An apparatus includes a showerhead and two or more pressure-controlled one-way valves connected to the showerhead and used for controlling flow of different processing gases into the showerhead. The pressure-controlled one-way valves are not externally controlled by any control systems. Instead, these valves open and close in response to preset conditions, such as pressure differentials and/or flow differentials. One example of such pressure-controlled one-way valves is a check valve. These valves generally allow the flow only in one direction, i.e., into the showerhead. Furthermore, lack of external controls and specific mechanical designs allow positioning these pressure-controlled one-way valves in close proximity to the showerhead thereby reducing the dead volume between the valves and the showerhead and also operating these valves at high temperatures.

18 Claims, 13 Drawing Sheets

HIGH PRODUCTIVITY COMBINATORIAL PROCESSING USING PRESSURE-CONTROLLED ONE-WAY VALVES

BACKGROUND

Controlling flow of precursors and other reagents into deposition chambers can be challenging, particularly when the precursors and reagents can easily react with each other and when multiple different precursors and reagents are needed to be supplied into the same deposition chamber. In a typical deposition apparatus, multiple lines for supplying different precursors and reagents are connected to a showerhead or another type of distribution device disposed within a deposition chamber. Each line may include multiple valves for introducing precursors and carrier gases into the line and purging the line. Furthermore, the line includes one valve connecting this line to the showerhead and controlling the flow of the precursors and reagents from the line and into the showerhead. This valve may be referred to as a "final valve" as there are typically no more downstream valves. The final valve needs to be positioned as close as possible to the showerhead to avoid "dead volume" issues.

A typical deposition apparatus includes externally controlled valves, which are connected to a system controller for controlling these valves. Specifically, externally controlled valves typically use electrical or electromagnetic actuators to move flow restrictors and other such components. The actuators also connected to the system controller by signal and/or power lines. Overall, the externally controlled valves are bulky and not temperature resistant. As such, when externally controlled valves are used, these valves cannot be positioned close to the showerhead because of the heat and access reasons. At the same time, many deposition processes are performed at high temperatures that cause heating of the showerheads, walls of the deposition chambers, and other components positioned close to the deposition chambers, which include final valves. Furthermore, many new deposition approaches, such as high productivity combinatorial (HPC) processing require many different supply lines connected to the same showerhead, which complicates positioning and maintenance of the valves. At the same time, moving the final valves away from the showerhead increases dead volumes and negatively impacts operation of these apparatuses.

SUMMARY

Provided are apparatus for high productivity combinatorial (HPC) processing of semiconductor substrates and HPC methods. An apparatus includes a showerhead and two or more self-controlled one-way valves connected to the showerhead and used for controlling flow of different processing gases into the showerhead. The self-controlled one-way valves are not externally controlled by any control systems. Instead, these valves have preset characteristics for opening and closing, such as pressure differentials and/or flow differentials. One example of such self-controlled one way valves is a check valve. These valves generally allow the flow only in one direction, i.e., into the showerhead. Furthermore, lack of external controls and specific mechanical designs allow positioning these self-controlled one way valves in close proximity to the showerhead thereby reducing the dead volume between the valves and the showerhead and also operating these valves at high temperatures.

In some embodiments, an apparatus for HPC processing of a semiconductor substrate can include a deposition chamber for enclosing the semiconductor substrate during processing of the semiconductor substrate. The apparatus may also include a showerhead for distributing processing gases into the deposition chamber during processing of the semiconductor substrate. Furthermore, the apparatus may include a first line for supplying a first one of the processing gases into the showerhead and a first self-controlled one-way valve for controlling a flow of the first one of the processing gases from the first line into the showerhead. In some embodiments, the first self-controlled one-way valve is a check valve.

The first self-controlled one-way valve may control the flow of the first one of the processing gases from the first line into the showerhead based on the pressure differential between the first line and the showerhead. In some embodiments, the apparatus also includes at least one controlled valve for controlling the flow of the first one of the processing gases into the first line. This controlled valve may be a controlled by a system controller. The system controller may be configured to control a pressure in the first line.

In some embodiments, the apparatus also includes a second line for supplying a second one of the processing gases into the showerhead and a second self-controlled one-way valve for controlling a flow of the second one of the processing gases from the second line into the showerhead. The first self-controlled one-way valve may be configured to prevent the second one of the processing gases from flowing into the first line. The first one of the processing gases may include a metal precursor. The second one of the processing gases includes an oxidation reagent or a nitridation reagent.

In some embodiments, the first self-controlled one-way valve is connected directly to the showerhead. The first self-controlled one-way valve may be configured to operate at a temperature of up to about 500° C. In some embodiment, the showerhead includes multiple isolated compartments for performing the HPC processing of the semiconductor substrate. Each of the multiple isolated compartments of the showerhead may be connected to a separate self-controlled one-way valve. Each of the multiple isolated compartments of the showerhead may be connected to at least two self-controlled one way valves, e.g., one of these self-controlled one way valves used for controlling the supply of a precursor and the other one for controlling the supply of the oxidizing reagent. In some embodiments, the multiple isolated compartments include at least four isolated compartments.

Provided also is a method of HPC processing of a semiconductor substrate. The method may include providing the semiconductor substrate into a deposition chamber and flowing a first processing gas into a showerhead provided inside the deposition chamber. The first processing gas may be flowed through a first line and a first self-controlled one way valve. A second self-controlled one-way valve may block the first processing gas from flowing into a second line while the first processing gas flows into the showerhead. The first self-controlled one-way valve and the second self-controlled one-way valve may be connected to the showerhead. In some embodiments, the pressure inside the second line is less than the pressure inside the showerhead while the first processing gas flows into the showerhead.

The method may also involve flowing a second processing gas into the showerhead in the deposition chamber. The second processing gas may flow through the second line and the second self-controlled one way valve. The first self-controlled one-way valve blocks the second processing gas from entering into the first line. In some embodiments, the pressure inside the first line is less than the pressure inside the showerhead while the second processing gas flows into the showerhead.

In some embodiments, the first processing gas includes a metal precursor. The second processing gas includes an oxidation reagent or a nitridation reagent. The first self-controlled one-way valve and the second self-controlled one-way valve are at a temperature of between about 200° C. and 500° C. during the processing of the semiconductor substrate.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

Figure 1:
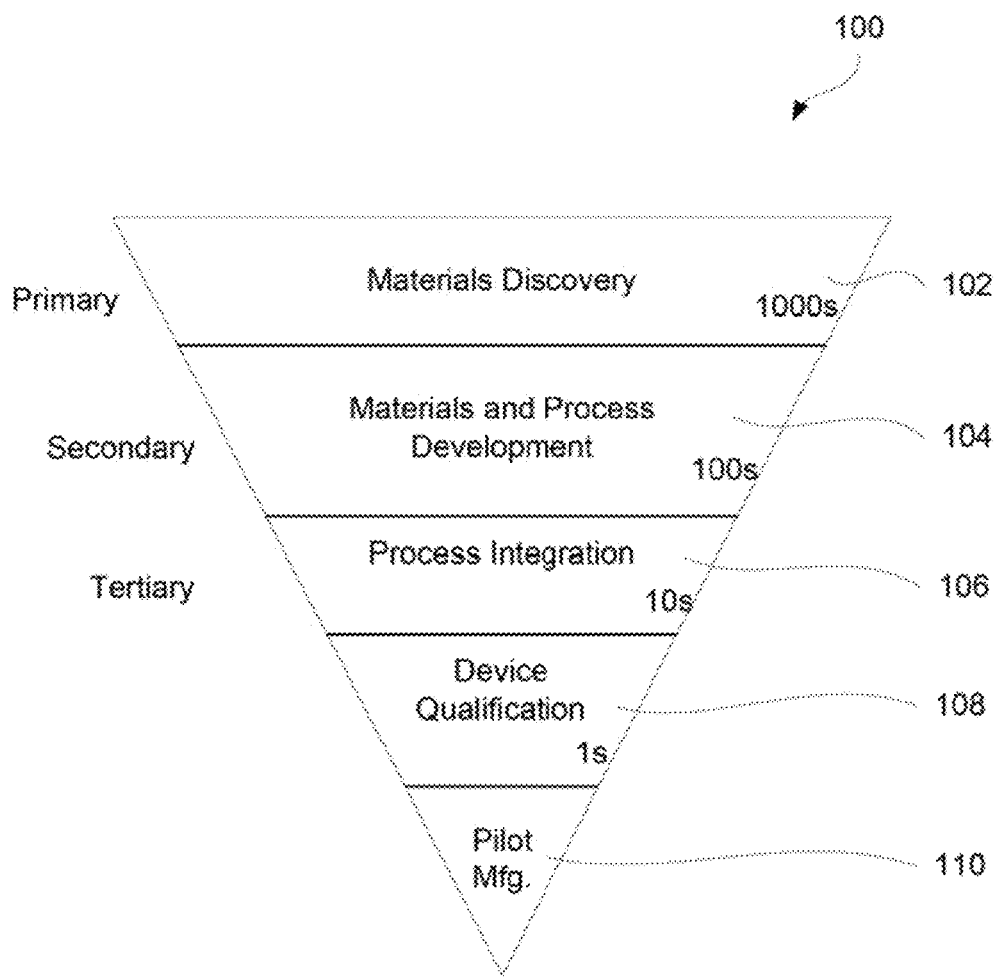
FIG. 1 is a schematic diagram for implementing combinatorial processing and evaluation, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Flow rates of gases and liquids are generally controlled with valves. Externally controlled valves, such as valves with electrical and/or electromechanical actuators are typically used for semiconductor equipment because of their control flexibility. An externally generated signal, e.g., a signal for a system controller, can be sent to a valve to open (fully or partially) or close this valve. The signal can be generated based on recipes, feedback, and other data available to the controller. The signal may be a part of the power supplied to the valve or provided in using a separate signal line.

While externally controlled valves offer the advantage of control flexibility, these valves are bulky and cannot withstand high temperatures. Furthermore, these valves need to be regularly serviced because of the mechanical complexity. At the same time, modern semiconductor equipment is often designed for use of multiple different reagents. These reagents often need to be supplied into the same deposition chamber using different supply lines and valves in these supply lines. One particular group of examples includes apparatus for high productivity HPC processing. The HPC equipment allows processing of substrates in a combinatorial manner using different reagents as further described below with reference to FIGS. 1-3. Combinatorial processing may require supply of many different gases using separate lines. One specific example of the HPC equipment is an ALD apparatus that has a combinatorial showerhead capable of individually processing four different quadrants of a substrate. Each of these quadrants needs at least two lines supplying two reagents, such as a precursor and an oxidant, independently of lines supplying precursors to the other quadrants. In other words, this combinatorial ALD apparatus needs at least eight different supply lines and eight accompanying sets of valves. An example of one valve arrangement using all externally controlled vales for this combinatorial ALD apparatus is shown in FIG. 8B. Large and complex valve arrangements can be difficult to service and troubleshoot.

Another limitation of externally controlled valves is their inability to operate at high temperatures. Because of their complex mechanical design, the externally controlled valves typical have a relative low maximum operating temperature, such as less than 200° C. Yet, when these valves are used as final valves that control the flow into deposition chamber (e.g., into a showerhead provided within a deposition chamber), the valves need to be positioned as close as possible to the chamber to avoid dead-volume issues. Unfortunately, these deposition chambers may emit heat during some operations. For example, some ALD processes are performed at chamber interior temperatures of 200° C. to 400° C., causing the chamber exterior to be heated accordingly.

The issues listed above with externally controlled valves are addressed by replacing at least some of them with two or more self-controlled one-way valves connected to a showerhead. These self-controlled one-way valves are used for controlling flows of different processing gases into the showerhead without any external controls. The self-controlled one-way valves may be preconfigured to open and close when processing conditions, such as pressures, flow rates, and the like, reach certain thresholds. For example, check valves may be used as self-controlled one-way valves. A check valve may be configured to open and allow the flow of a process gas when a pressure differential across the valve reaches a certain value, or to close and block the flow of the process gas when a pressure differential across the valve falls below a certain value.

Unlike externally controlled valves, self-controlled one-way valves may be small in size, have a simple mechanical design, and be rated to operate at very high temperature. As such, the self-controlled one-way valves may be positioned close to deposition chambers and, in some embodiments, inside the deposition chambers while retaining their operability. In some embodiments, the self-controlled one-way valves are configured to operate at a temperature of up to about 500° C. The self-controlled one-way valves may be also protected from the environment.

Two or more self-controlled one-way valves may be provided on an apparatus for HPC processing of semiconductor substrates. Specifically, the apparatus may include a showerhead and the two or more self-controlled one-way valves connected to the showerhead. The showerhead may be a combinatorial showerhead configured to individually process two or more compartments (e.g., quadrants) on the substrate. Each portion of the showerhead corresponding to each compartment may be connected to a separate set of two or more self-controlled one-way valves. These self-controlled one-way valves are not externally controlled by any control systems. Instead, these valves open and close in response to preset stimuli or conditions, such as threshold pressure differentials and/or threshold flow differentials.

HPC Examples

A brief description of HPC methodology may help to better understand various features of apparatuses for HPC processing, which are further described below. As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of articles including barrier layers. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning HPC processing techniques have also been successfully adapted to deposition processes such as physical vapor deposition (PVD), atomic layer deposition (ALD), and chemical vapor deposition (CVD). However, HPC processing techniques have not been successfully adapted to the development of articles including barrier layers, particularly when barrier layers are used for protecting silver based reflective layers.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 904. Evaluation of the materials is performed using metrology tools such as electronic testers and imaging tools (i.e., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of articles manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optima, i.e., where the best conditions and materials for each manufacturing unit operation is considered in isolation, the embodiments described below consider interactions effects introduced due to the multitude of processing operations that are performed and the order in which such multitude of processing operations are performed when fabricating an article containing a barrier layer. A global optimum sequence order is therefore derived and as part of this derivation, the unit processes, unit process parameters, and materials used in the unit process operations of the optimum sequence order are also considered.

The embodiments described further analyze a portion or sub-set of the overall process sequence used to manufacture an article containing a barrier layer. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate, which are equivalent to the structures formed during actual production of the article containing a barrier layer. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
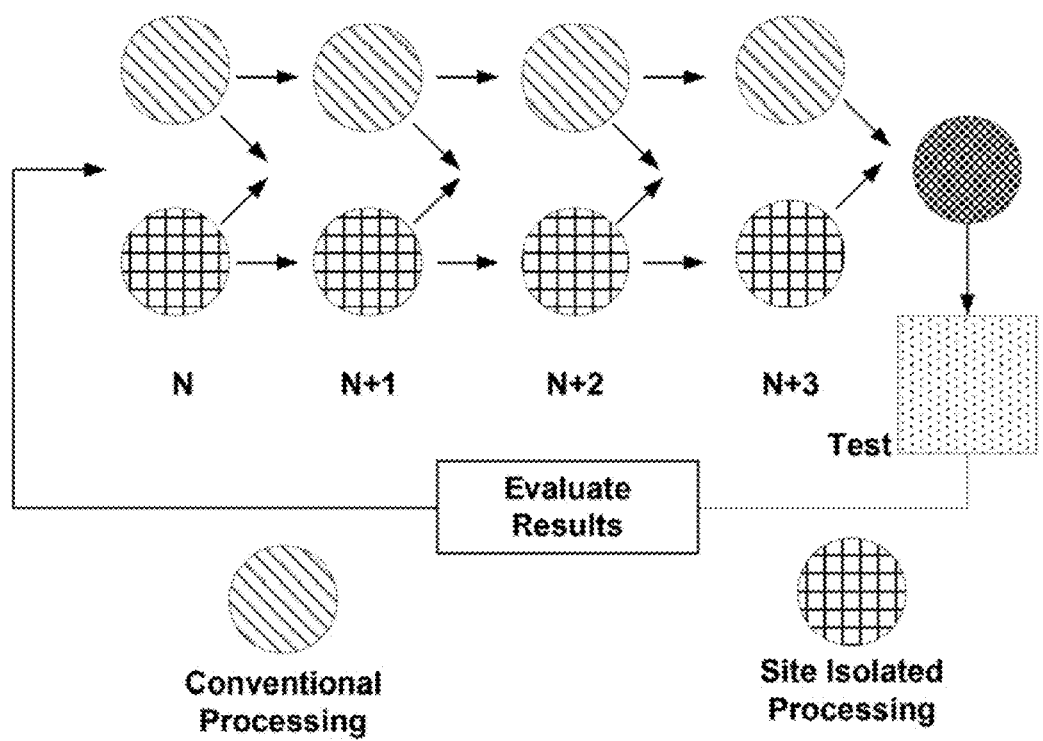
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in barrier layer manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
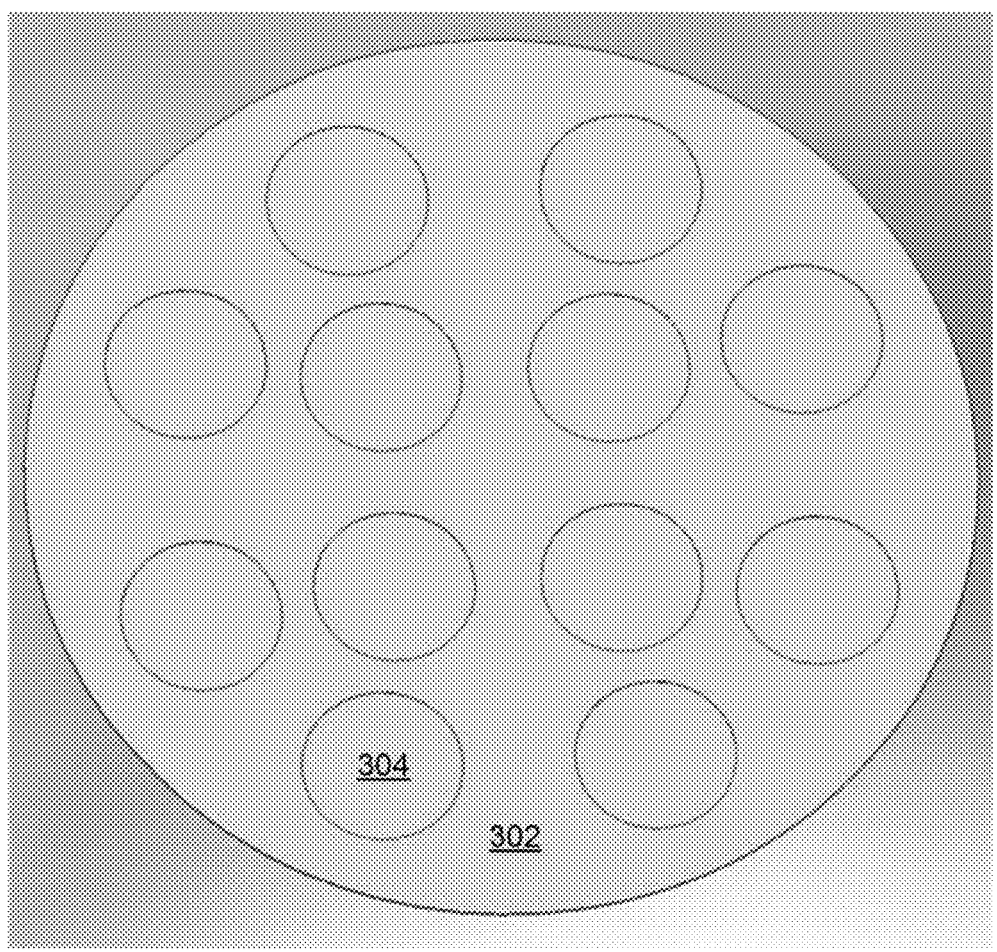
FIG. 3 illustrates a schematic diagram of a substrate that has been processed in a combinatorial manner.

FIG. 3 illustrates one example of a pattern of site-isolated regions that can be processed using an apparatus for HPC processing, in accordance with some embodiments. In FIG. 3, the substrate is divided into twelve site-isolated regions 304 on substrate 302. Therefore, in this example, twelve independent experiments could be performed on a single substrate. Those skilled in the art will understand that the twelve site-isolated regions illustrated in FIG. 3 are intended as an example and that any number of site-isolated regions could be formed. The substrate may then be processed through a next step that may be conventional or may also be a combinatorial step as discussed earlier with respect to FIG. 2.

ALD Technique Examples

Apparatuses for HPC processing described herein may be used for any kinds of deposition processes that involve supply of gases or liquids into deposition chamber. Some examples of such processes involve chemical vapor deposition (CVD), atomic layer deposition (ALD), and variations thereof. An ALD process will now briefly described to provide better understanding of various apparatus and processing features presented in this description. However, one having ordinary skills in the art would understand that other types of deposition processes are also within the scope.

During ALD, a precursor containing a first element is introduced into the ALD chamber using a first supply line equipped with a first self-controlled one-way valve. The precursor may be introduced in the form of a pulse and may flow through a showerhead. When a combinatorial showerhead is used, the precursor may flow only to a portion of this showerhead corresponding to one site isolated regions. The introduced precursor adsorbs (e.g., saturatively chemisorbs or physisorbs) on the deposition surface. Subsequent purging with a purging gas removes unreacted precursors, reaction products, and other undesirable components from the chamber. In some embodiments, the purging gas may be also supplied through the first supply line. It should be noted that other supply lines may be blocked by their respective self-controlled one-way valve during this operation.

After the initial precursor pulsing and purging, a subsequent pulse may introduce an oxidizing agent, a reducing agent, or any other type of, which may be any reagent configured to react with the precursor introduced in the previous cycle. The reagent may or may not include oxygen. For example, the reagent may include nitrogen and may be used to form metal nitrides. In general, the reagent may include one or more of oxygen, nitrogen, and sulfur. The reagent may be introduced using a second supply line equipped with a second self-controlled one-way valve. The reagent may be introduced in the form of a pulse and may be flown through the showerhead. The first self-controlled one-way valve may be closed at this point to prevent the reagent from getting into the first supply line and reacting with the remaining precursor in this line.

The reagent reacts with the adsorbed element to form oxides. Reaction byproducts and excess reactants are purged from the deposition chamber by supplying a purging gas through the second supply line. The saturation during the reaction and purging stages makes the growth self-limiting. This feature helps to improve deposition uniformity and conformality and allows more precise control of the resulting resistive switching characteristics.

The temperature of the substrate during atomic layer deposition may be between about 200° C. to 500° C. The precursor may be either in gaseous phase, liquid phase, or solid phase. If a liquid or solid precursor is used, then it may be transported into the chamber an inert carrier gas, such as helium or nitrogen. Some examples of precursors include tetrakis(diethylamido) hafnium ($[(CH_2CH_3)_2N]_4Hf$)—also known as TEMAH, tetrakis(ethylmethylamido) hafnium ($[(CH_3)(C_2H_5)N]_4Hf$), tetrakis(dimethylamido) hafnium ($[(CH_3)_2N]_4Hf$)—also known as TDMAH, and trimethyl aluminum (($CH_3)_3Al$)—also known as TMA. The reagent may include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (e.g., O, $O_2$, $O_3$, and OH radicals produced by heat, hot-wires, and/or plasma). The ALD cycles repeated until the entire structure is formed.

Apparatus Examples

Figure 4:
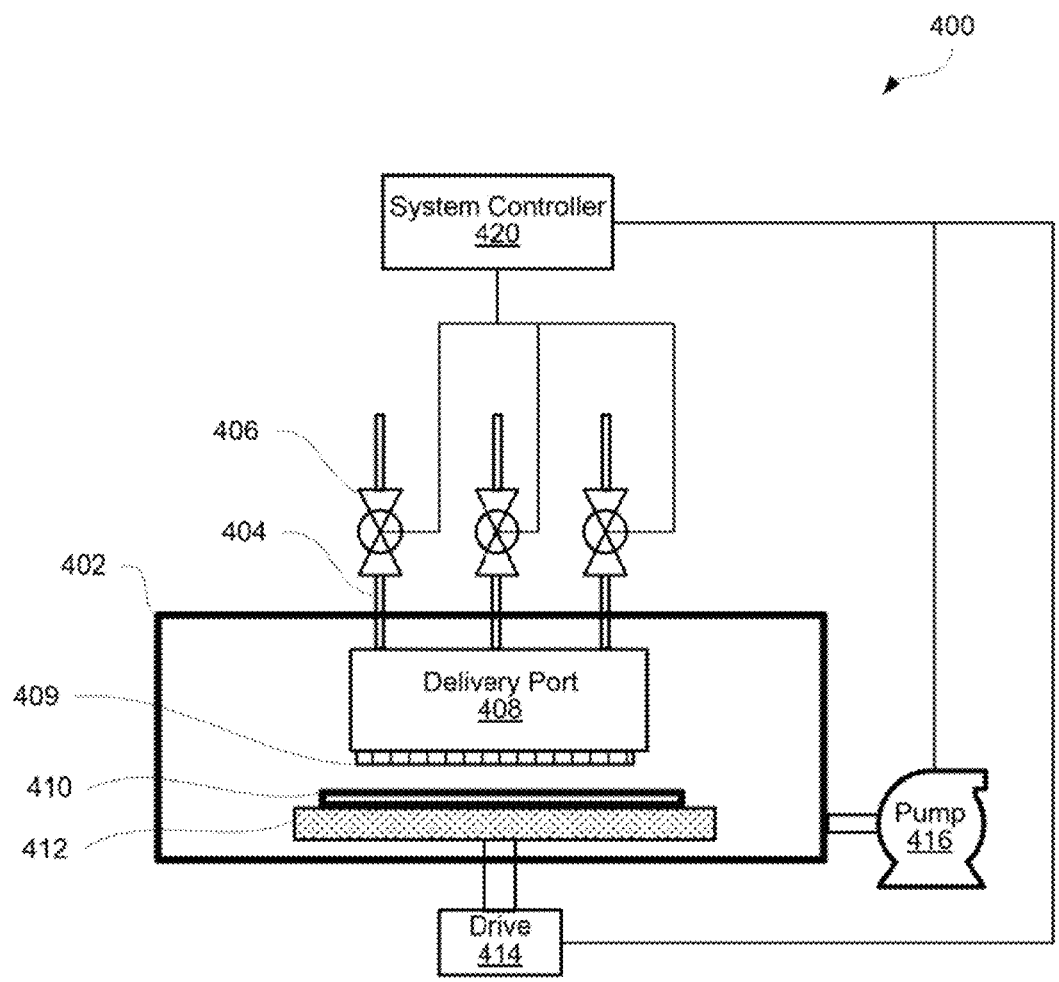
FIG. 4 illustrates a schematic representation of atomic layer deposition apparatus (ALD), in accordance with some embodiments.

FIG. 4 illustrates a schematic representation of ALD apparatus 400 for HPC processing. For clarity, some components of apparatus 400 are not included in this figure, such as a wafer-loading port, wafer lift pins, and electrical feedthroughs. Apparatus 400 includes deposition chamber 402 connected to processing gas delivery lines 404. While FIG. 4 illustrates three delivery lines 404, any number of delivery lines may be used. Each line may be equipped with a valve 406 for controlling the delivery rates of processing gases into deposition chamber 402. In some embodiments, gases are provided into delivery port 408 prior to exposing substrate 410 to processing gases. Delivery port 408 may be used for premixing gases (e.g., precursors and diluents) and evenly distributing the gases over the surface of substrate 410. Delivery port 408 is sometimes referred to as a showerhead. Delivery port 408 may include a diffusion plate 409 having with multiple holes for gas distribution. Various aspects of delivery lines 404, valves 406, and delivery port 408 are further described below with reference to FIGS. 5-10.

Deposition chamber 402 encloses substrate support 412 for holding substrate 410 during its processing. Substrate support 412 may be made from a thermally conducting metal (e.g., W, Mo, Al, Ni) or other like materials (e.g., a conductive ceramic) and may be used to maintain the substrate temperature at desired levels. Substrate support 412 may be connected to drive 414 for moving substrate 410 during loading, unloading, process set-up, and sometimes even during processing. Deposition chamber 402 may be connected to vacuum pump 416 for evacuating reaction products and unreacted gases from deposition chamber 402 and for maintaining the desirable pressure inside chamber 402.

Apparatus 400 may include system controller 420 for controlling process conditions during HPC processing. Controller 420 may include one or more memory devices and one or more processors with a CPU or computer, analog and/or digital input/output connections, stepper motor controller boards, etc. In some embodiments, controller 420 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments. While FIG. 4 illustrates valves 406 being controlled by system controller 420, apparatus 400 may include two or more self-controlled one-way valves that are not controlled by system controller 420 as further described below with reference to FIGS. 9 and 10.

Figure 5:
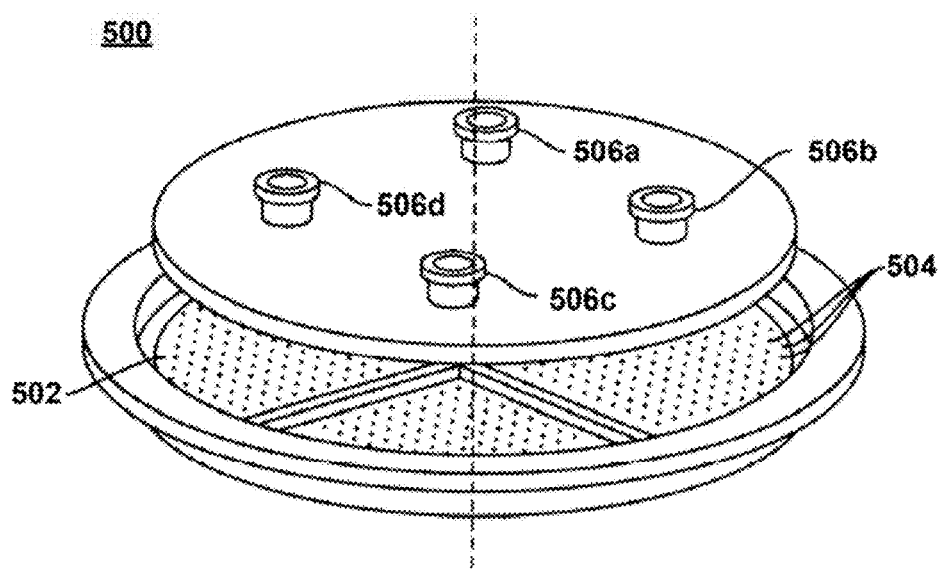
FIG. 5 illustrates a schematic diagram of a combinatorial showerhead for use in an ALD apparatus, in accordance with some embodiments.

FIG. 5 illustrates an example of an ALD or CVD showerhead 500 used for combinatorial processing. Details of this type of showerhead and its use may be found in U.S. patent application Ser. No. 12/05,729 entitled "Vapor Based Combinatorial Processing" filed on Jan. 14, 2008 and claiming priority to Provisional Application No. 50/970,199 filed on Sep. 5, 2001, U.S. patent application Ser. No. 12/05,759 entitled "Vapor Based Combinatorial Processing" filed on Jan. 14, 2008 and claiming priority to Provisional Application No. 50/970,199 filed on Sep. 5, 2001, and U.S. patent application Ser. No. 12/205,578 entitled "Vapor Based Combinatorial Processing" filed on Sep. 5, 2008 which is a Continuation application of the U.S. patent application Ser. No. 12/05,729 and claiming priority to Provisional Application No. 50/970,199 filed on Sep. 5, 2001, all of which are herein incorporated by reference.

ALD or CVD showerhead 500 illustrated in FIG. 5 may include multiple compartments 502 used to deposit materials on a substrate. In this example, four compartments (quadrants) have been illustrated. Those skilled in the art will understand that the showerhead can be divided into any useful number of compartments such as 2, 4, 6, 8, or 12 segments. As an example, in the case of a round substrate, four different materials and/or process conditions could be used to deposit materials in each of the four quadrants of the substrate (not shown). Precursor gases, reactant gases, purge gases, and the like are introduced into each of the four regions of the showerhead through gas inlet conduits 506a-506d. For simplicity, the four quadrants 502 of showerhead 500 have been illustrated as un-subdivided compartments. Those skilled in the art will understand that each quadrant 502 of showerhead 500 may be designed to have two or more isolated gas distribution systems so that multiple reactive gases may be kept separated until they react at the substrate surface. Also for simplicity, on a single gas inlet conduit 506a-506d is illustrated for each of the four quadrants. Those skilled in the art will understand that each quadrant 502 of showerhead 500 may have multiple gas inlet conduits. The gases exit each quadrant 502 of showerhead 500 through holes 504 in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 5 is operable to be used with any of a CVD, PECVD, ALD, or PEALD technology.

Figure 6A:
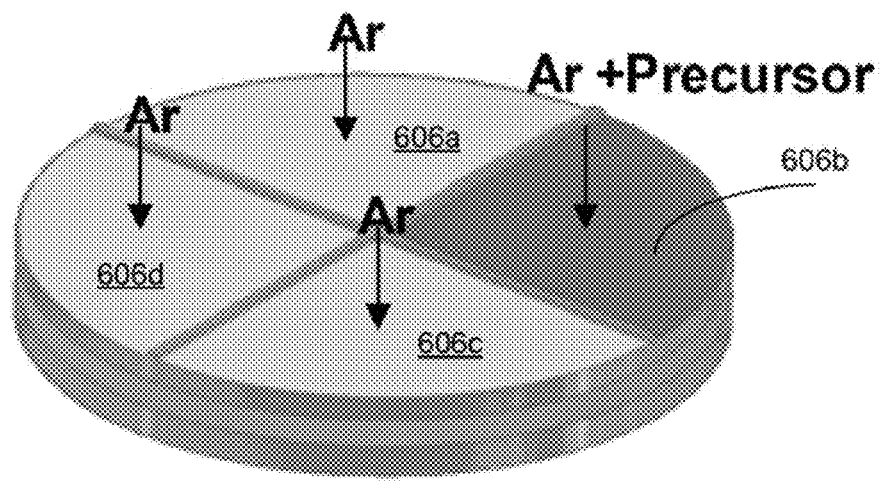
FIGS. 6A and 6B illustrate schematic diagrams of the use of a combinatorial showerhead, in accordance with some embodiments.
Figure 6B:
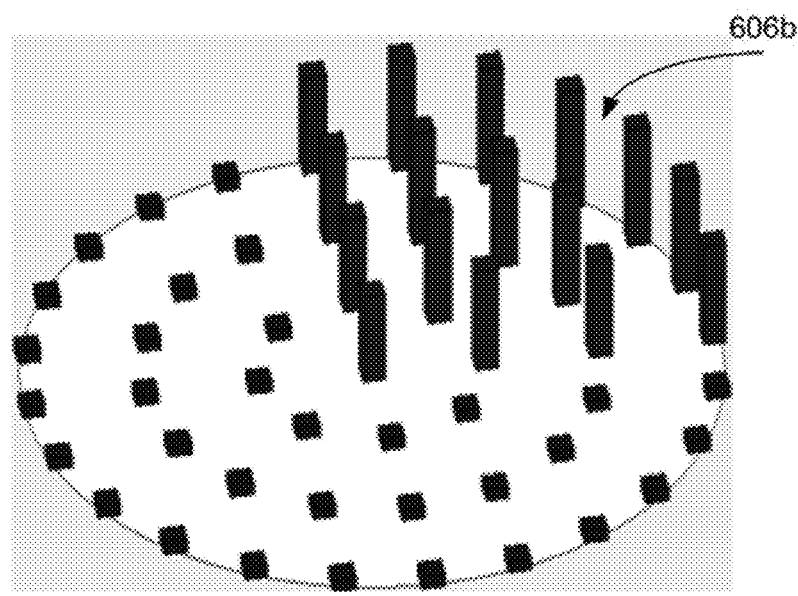

FIGS. 6A and 6B illustrate schematic diagrams of the use of a combinatorial ALD showerhead according to some embodiments described herein. In FIG. 6A, the four quadrants of the showerhead discussed with reference to FIG. 5 are illustrated, 606a-606d. As indicated, three of the quadrants (i.e. 606a, 606c, and 606d) have only Ar flowing through them. Therefore, there would not be any deposition on the substrate under these three quadrants. As indicated, quadrant 606b has Ar and one or more deposition precursors flowing through it. Therefore, a material would be deposited on the substrate under this quadrant. The process parameters can be varied among the four quadrants. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 6B illustrates the resulting thickness profile of the deposited material on the substrate using the showerhead configuration discussed with reference to FIG. 6A. The height of the bars corresponding to quadrant 606b in FIG. 6A indicates that a film was deposited under this portion of the showerhead. Meanwhile, there is no discernable deposition in quadrants 606a, 606c, and 606d. These figures illustrate how the compartmented showerhead as discussed with reference to FIG. 6 can be used for combinatorial processing of regions of the substrate.

Figure 7:
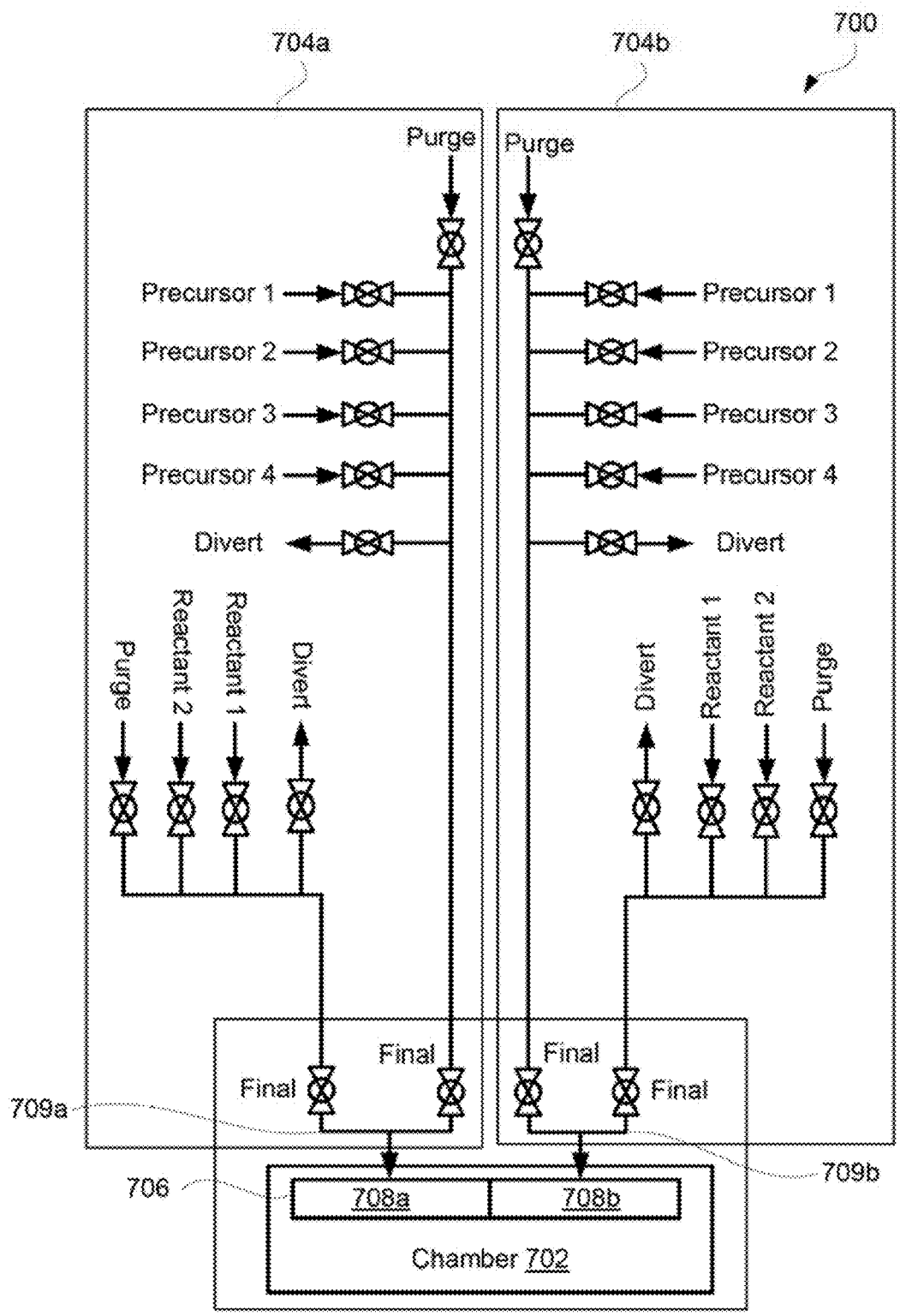
FIG. 7 is a schematic piping diagram illustrating various lines and valves for supplying precursors and other reagents into two quadrants of a combinatorial showerhead, in accordance with some embodiments.

FIG. 7 is a schematic piping diagram of an apparatus 700 having a combinatorial showerhead 706 disposed inside deposition chamber 702, in accordance with some embodiments. For simplicity, combinatorial showerhead 706 is illustrated with only two separate compartments 708a and 708b. However, one having ordinary skills in the art would understand that any number of compartments can be used. For example, as shown in FIG. 5 and described above, a combinatorial showerhead may have four compartments. Each compartment has its own set of delivery lines. Specifically, compartment 708a is connected to set 704a, while compartment 708b is connected to set 704b. Each set of delivery lines include a number of valves connected to the various sources of precursors, reactants, purge gases, divert/exhaust lines. The flow into showerhead 706 is controlled by a set of final valves. In this example, each set of delivery lines has two final valves, one connected to precursor lines and one connected to reactant lines. Overall, FIG. 7 illustrates four final valves.

The final valves need to be disposed close to showerhead 706 to minimize the dead volume. For purposes of this disclosure, the dead volume is defined as a volume between the final valve and the showerhead. The dead volume for set 704a is shown with element 709a, while the dead volume for set 704b is shown with element 709b. For example, the dead volume may be reduced by as much as 2-10 times. In one example, the length of a tube between an externally controlled valve and the entrance to the showerhead is about 5-6 inches. When the externally controlled valve was replaced with a check valve, the length of the tubing was reduced to about 1 inch. The dead volume is accessible for all gases supplied into showerhead 706 and should be minimized. As such, the final valves need to be positioned as close as possible to showerhead 706 and to chamber 702 that encloses the showerhead.

Figure 8A:
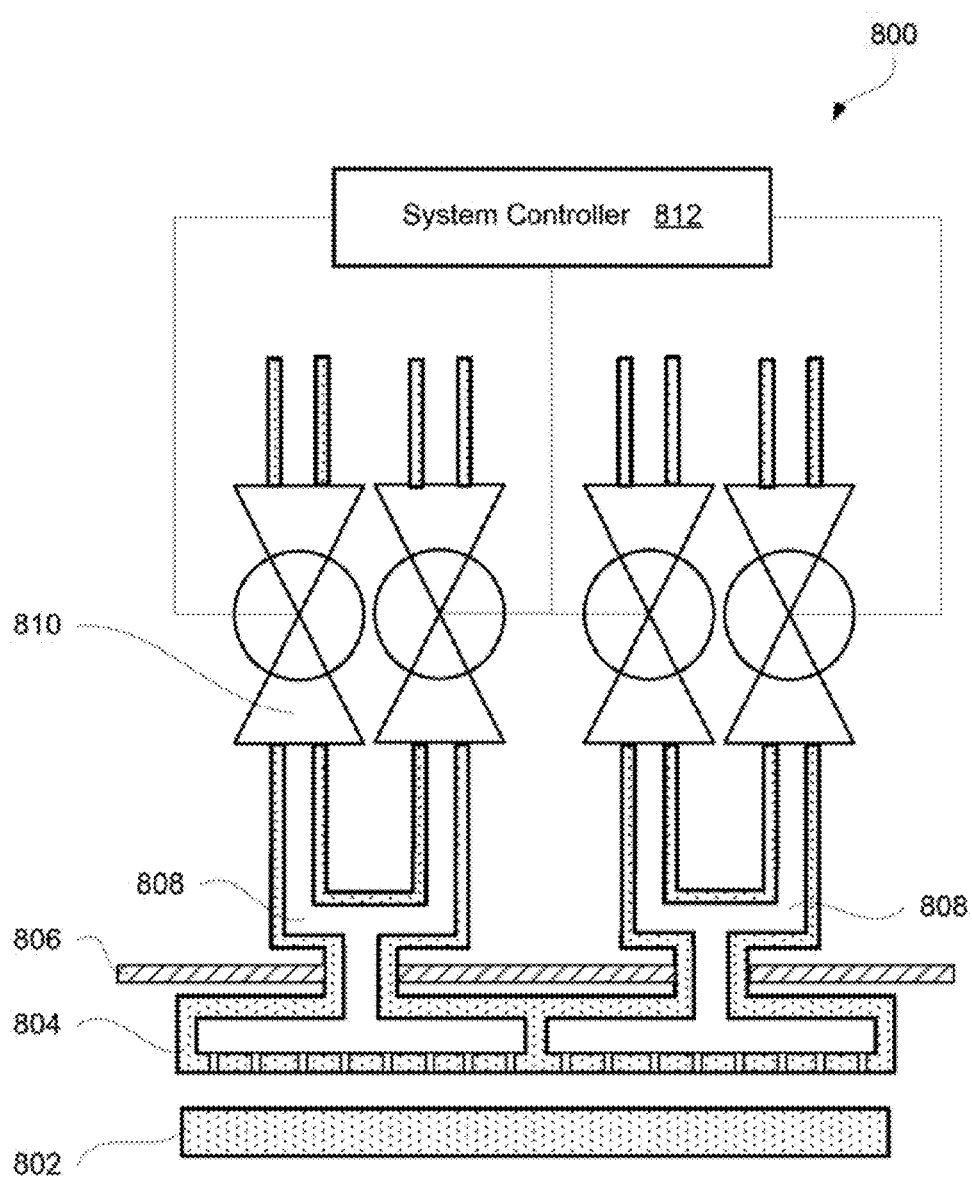
FIG. 8A illustrates a schematic representation of a cross-section of a combinatorial showerhead connected to two external-controlled valves, in accordance with some embodiments.
Figure 8B:
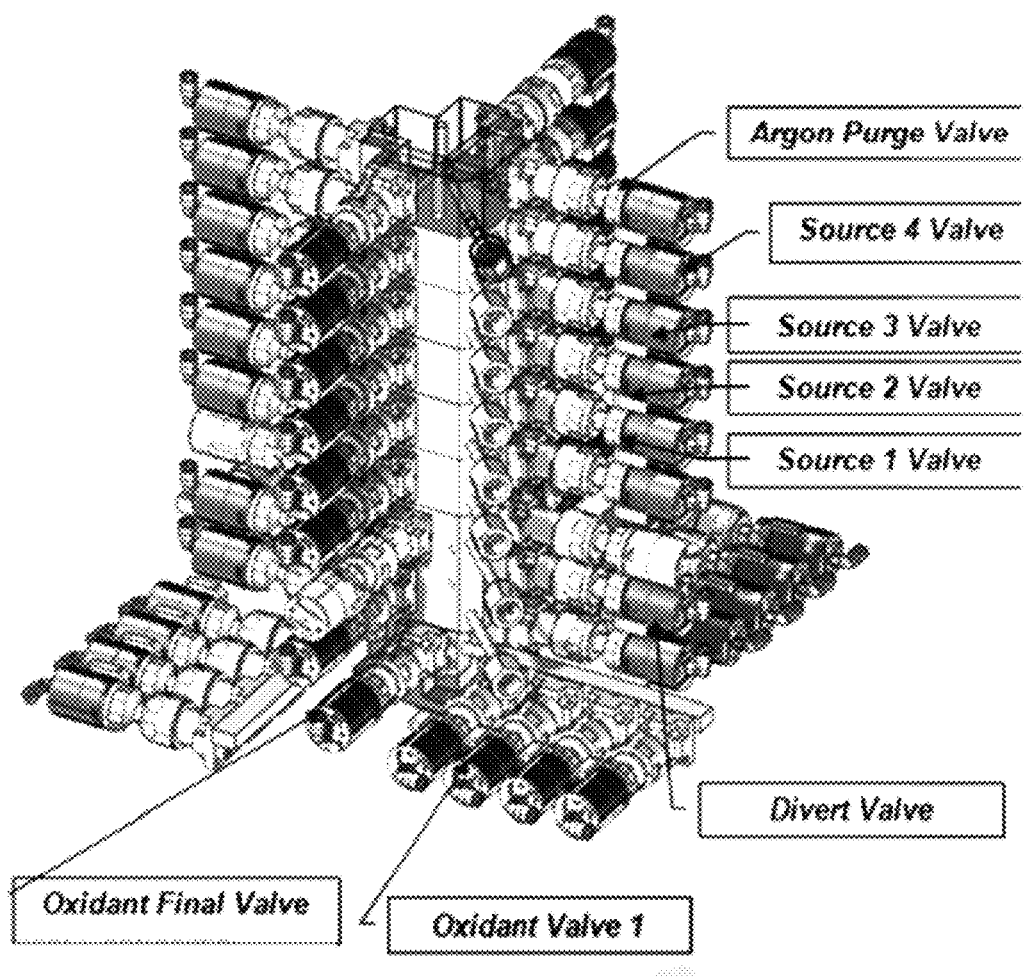
FIG. 8B illustrates a typical arrangement of valves for supplying precursors and other reagents into four quadrants of a combinatorial showerhead, in accordance with some embodiments.

FIG. 8A is a schematic cross-sectional representation of a portion of apparatus 800 that is represented by the schematic piping diagram in FIG. 7. Apparatus 800 includes combinatorial showerhead 804 disposed within chamber 806. Substrate 802 is show for reference only. The flow of gases into showerhead 804 is controlled by valves 810. Dead volume is shown with elements 808. If valves 810 are externally controlled valves and, for example, are controlled by system controller 812 as shown in FIG. 8A, then these valves have to be separated from showerhead 804 and chamber 806 to ensure that valves 810 are not overheated. This separation of valves 810 and showerhead 804 increases dead volume 808.

Figure 9:
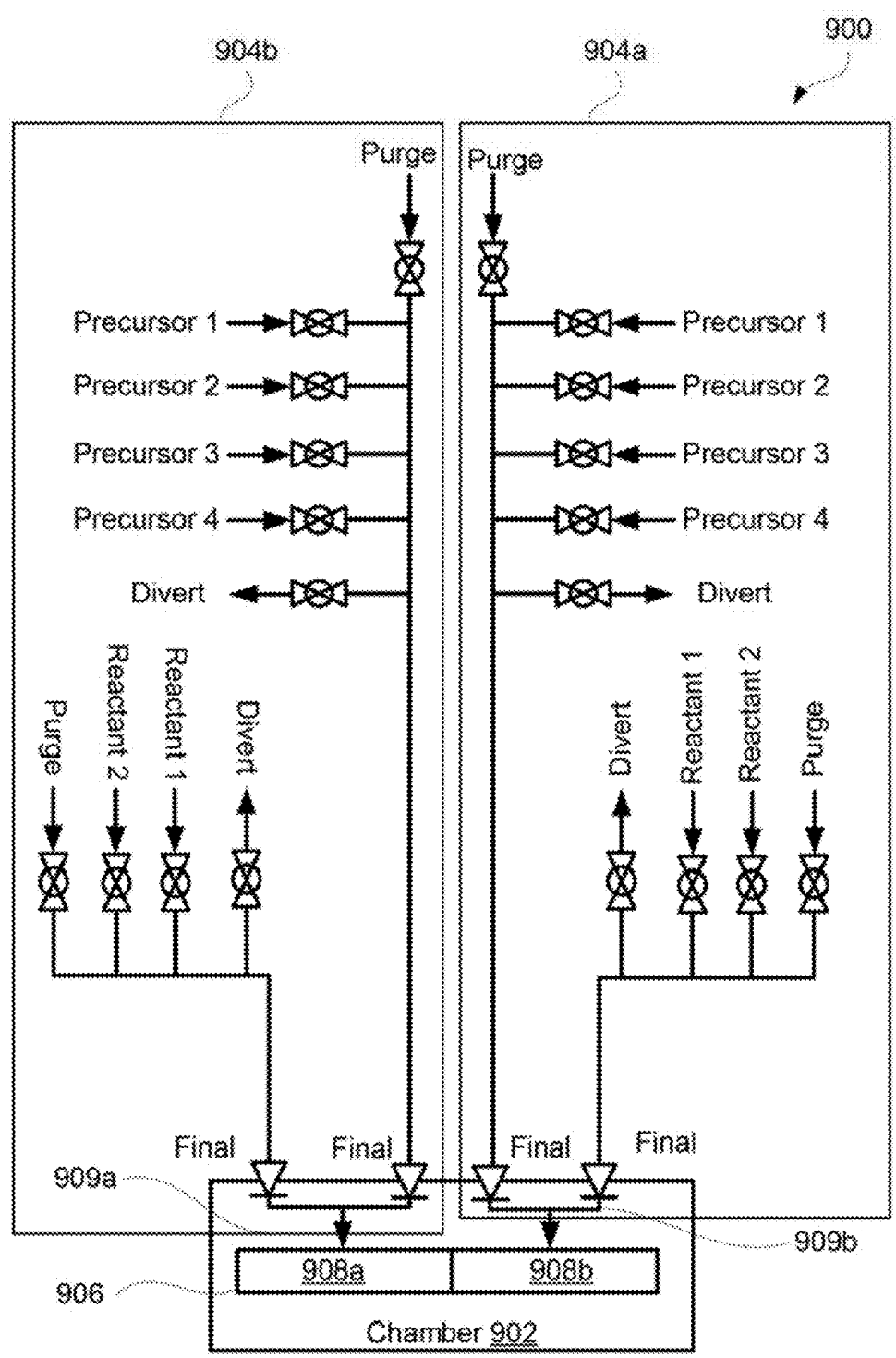
FIG. 9 is a schematic piping diagram illustrating various lines and valves, including two self-controlled one-way valves, for supplying precursors and other reagents into two quadrants of a combinatorial showerhead, in accordance with some embodiments.

FIG. 9 is a schematic piping diagram illustrating an apparatus 900 for HPC processing that includes four self-controlled one-way valves operable as final valves, in accordance with some embodiments. This diagram is similar to the one described above with reference to FIG. 7. Specifically, apparatus 900 includes combinatorial showerhead 906 having two separate compartments 908a and 908b. Compartment 908a is connected to set 904a, while compartment 908b is connected to set 904b. Each set of delivery lines include a number of valves connected to the various sources of precursors, reactants, purge gases, divert/exhaust lines. The flow into showerhead 906 is controlled by a set of final valves. However, unlike the apparatus represented by the diagram in FIG. 7, the final valves of apparatus 900 are self-controlled one-way valves. As a result these valves can be positioned closer to showerhead 906 and chamber 902. In fact, as FIG. 9 illustrates, portions of the final self-controlled one-way valves may even extend into chamber 902. This proximity of the final valves allows reducing the dead volumes shown with elements 909a and 909b and as further described below with reference to FIG. 10.

Figure 10:
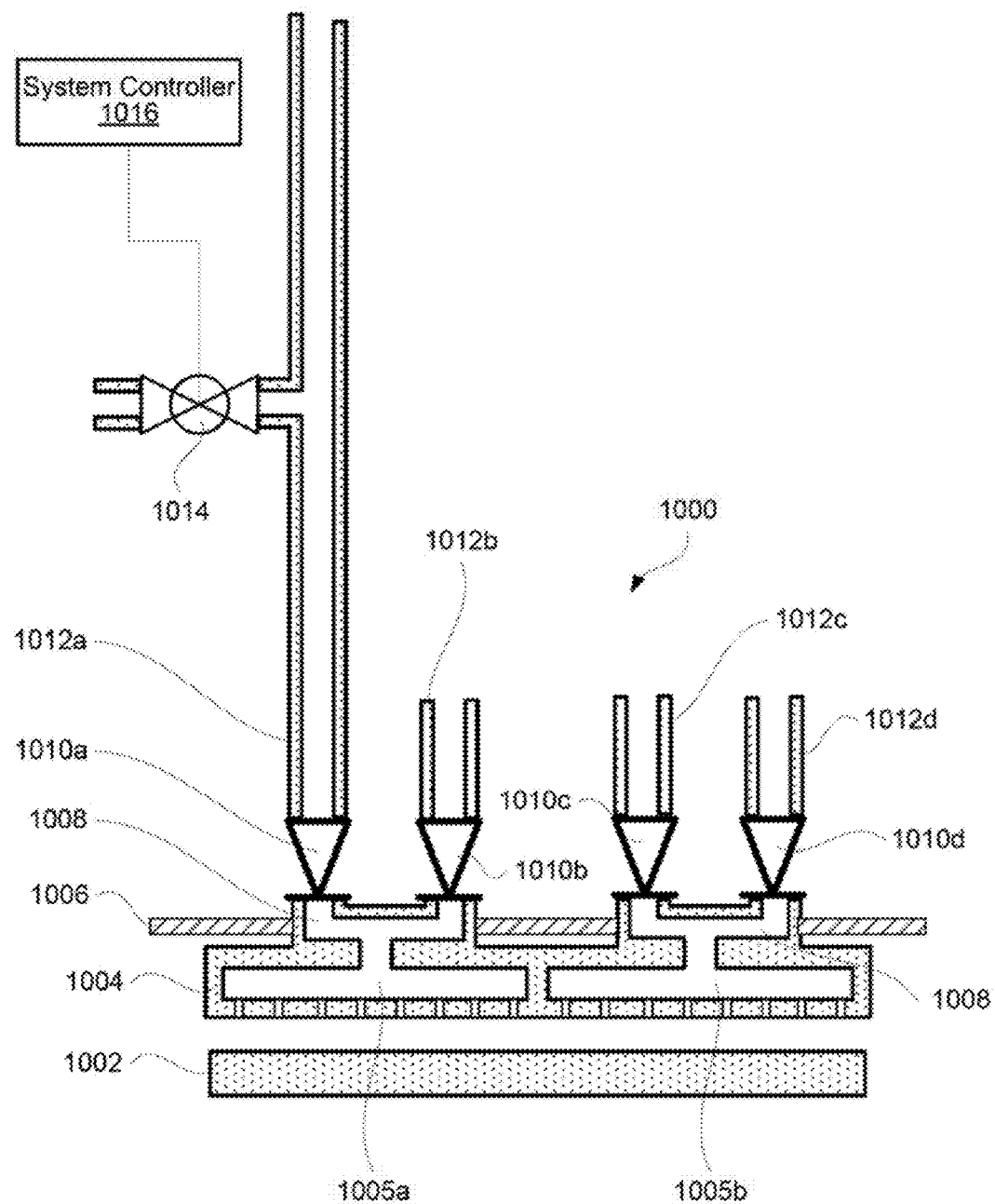
FIG. 10 illustrates a schematic representation of a cross-section of a combinatorial showerhead connected to two self-controlled one-way valves, in accordance with some embodiments.

Specifically, FIG. 10 is a schematic cross-sectional representation of a portion of apparatus 1000 that is represented by the schematic piping diagram in FIG. 8. Apparatus 1000 includes combinatorial showerhead 1004 disposed within chamber 1006. Substrate 1002 is show for reference only. The flow of gases into showerhead 1004 is controlled by valves 1010a-1010d. Valves 1010a-1010d are self-controlled one-way valves and can be positioned closer to showerhead 1004. As a result, dead volumes 1008 are substantially less than that for other types of valves that need to be kept further away from the chamber (as, for example, shown in FIG. 8A). Furthermore, these self-controlled one-way valves do not need to be controlled by the system controller. For example, pressure differentials between each line 1012a-1012d and showerhead 1004 may be used to control whether valves 1010a-1010d are closed or open.

Apparatus 1000 may be used for HPC processing of semiconductor substrate 1002. Apparatus 1000 includes deposition chamber 1006 for enclosing semiconductor substrate 1002 during processing of semiconductor substrate 1002 (the enclosure aspects are shown in FIG. 4 and described above). Apparatus 1000 also includes showerhead 1004 for distributing processing gases into deposition chamber 1006 during processing of semiconductor substrate 1002. Apparatus 1000 includes a first line 1012a for supplying a first processing gas into showerhead 1004 and a first self-controlled one-way valve 1010a for controlling the flow of the first processing gas from first line 1012a into showerhead 1004. First self-controlled one-way valve 1010a may be controlled using various process conditions, such as pressure differential, flow rate, and the like. Specifically, first self-controlled one-way valve 1010a may control the flow of the first processing gas from first line 1012a into the showerhead based on a pressure differential between first line 1012a and showerhead 1004.

In addition to first self-controlled one-way valve 1010a, apparatus 1000 may include at least one controlled valve 1014 for controlling a flow of the first processing gases into first line 1012a. Unlike first self-controlled one-way valve 1010a, controlled valve 1014 is externally controlled by system controller 1016. Furthermore, controlled valve 1014 may have a mechanism that is actuated by system controller 1016, such as an electrical actuator (e.g., a step motor). Controlled valve 1014 is positioned upstream from first self-controlled one-way valve 1010a and may be used to control the pressure in first line 1012a. For example, the controlled valve may be placed in an upstream location where the temperature remains within the controlled valve's preferred operating range, and/or where it may be conveniently reached for adjustment, servicing, or replacement.

In some embodiments, apparatus 1000 includes a second line 1012b for supplying a second processing gas into showerhead 1004. The apparatus also include a second self-controlled one-way valve 1010b for controlling a flow of the second processing gas from second line 1012b into showerhead 1004. First self-controlled one-way valve 1010a is configured to prevent the second processing gas from flowing into first line 1012a (e.g., backing up into first line 1012a from showerhead compartment 1005a).

Two lines 1012a and 1012b and two self-controlled one-way valves 1010a and 1010b may be used to supply pairs of processing gases that need to be kept separate. Preventing the processing gases from mixing prevents cross-contamination and build-up of byproducts within lines 1012a and 1012b and self-controlled one-way valves 1010a and 1010b. Each of lines 1012a-1012d may include a separate one of self-controlled one-way valves 1010a-1010d at the point where the line is connected to showerhead 1004. In some embodiments, a self-controlled one-way valve is connected directly to the showerhead. One or more of self-controlled one-way valves 1010a-1010d may be configured to operate at a temperature of up to about 500° C.

In some embodiments, showerhead 1004 includes multiple isolated compartments 1005a and 1005b for performing HPC processing of semiconductor substrate 1002. Each of multiple isolated compartments 1005a and 1005b is connected to at least one separate self-controlled one-way valve. As shown in FIG. 10, isolated compartment 1005a is connected to self-controlled one-way valves 1010a and 1010b, while isolated compartment 1005b is connected to self-controlled one-way valves 1010c and 1010d. For example, one self-controlled one-way valve (e.g., self-controlled one-way valve 1010a) may be used for a metal precursor and another self-controlled one-way valve (e.g., self-controlled one-way valve 1010b) may be used for an oxidizing reagent.

Figure 11:
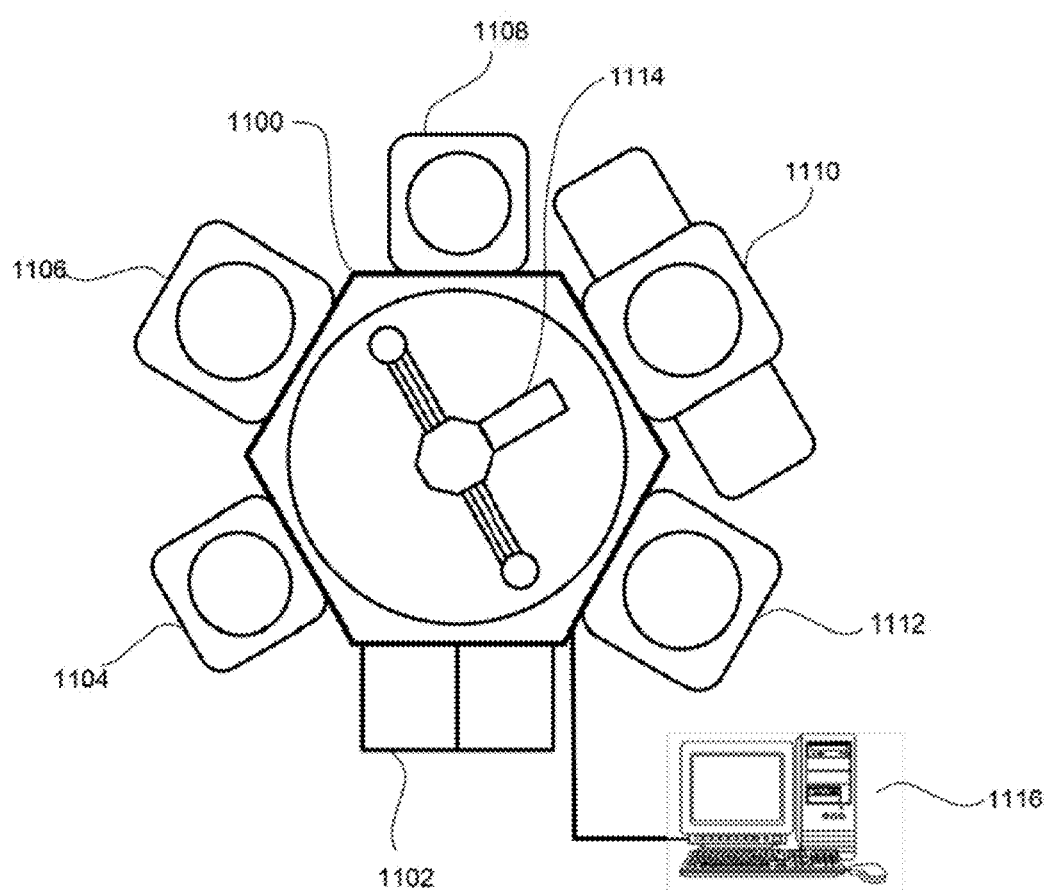
FIG. 11 illustrates a schematic diagram of a cluster system, in according with some embodiments.

FIG. 11 is a simplified schematic diagram illustrating an integrated high productivity combinatorial (HPC) system in accordance with some embodiments of the invention. HPC system includes a frame 1100 supporting a plurality of processing modules. It should be appreciated that frame 1100 may be a unitary frame in accordance with some embodiments. In some embodiments, the environment within frame 1100 is controlled. Load lock/factory interface 1102 provides access into the plurality of modules of the HPC system. Robot 1114 provides for the movement of substrates (and masks) between the modules and for the movement into and out of the load lock 1102. Modules 1104-1112 may be any set of modules and preferably include one or more combinatorial modules. For example, module 1104 may be an orientation/degassing module, module 1106 may be a clean module, either plasma or non-plasma based, modules 1108 and/or 1110 may be combinatorial/conventional dual purpose modules. Module 1112 may provide conventional clean or degas as necessary for the experiment design. In some embodiments, the modules include one or more combinatorial PVD modules. In some embodiments, the modules include one or more combinatorial ALD modules.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 1116, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Processing Examples

Figure 12:
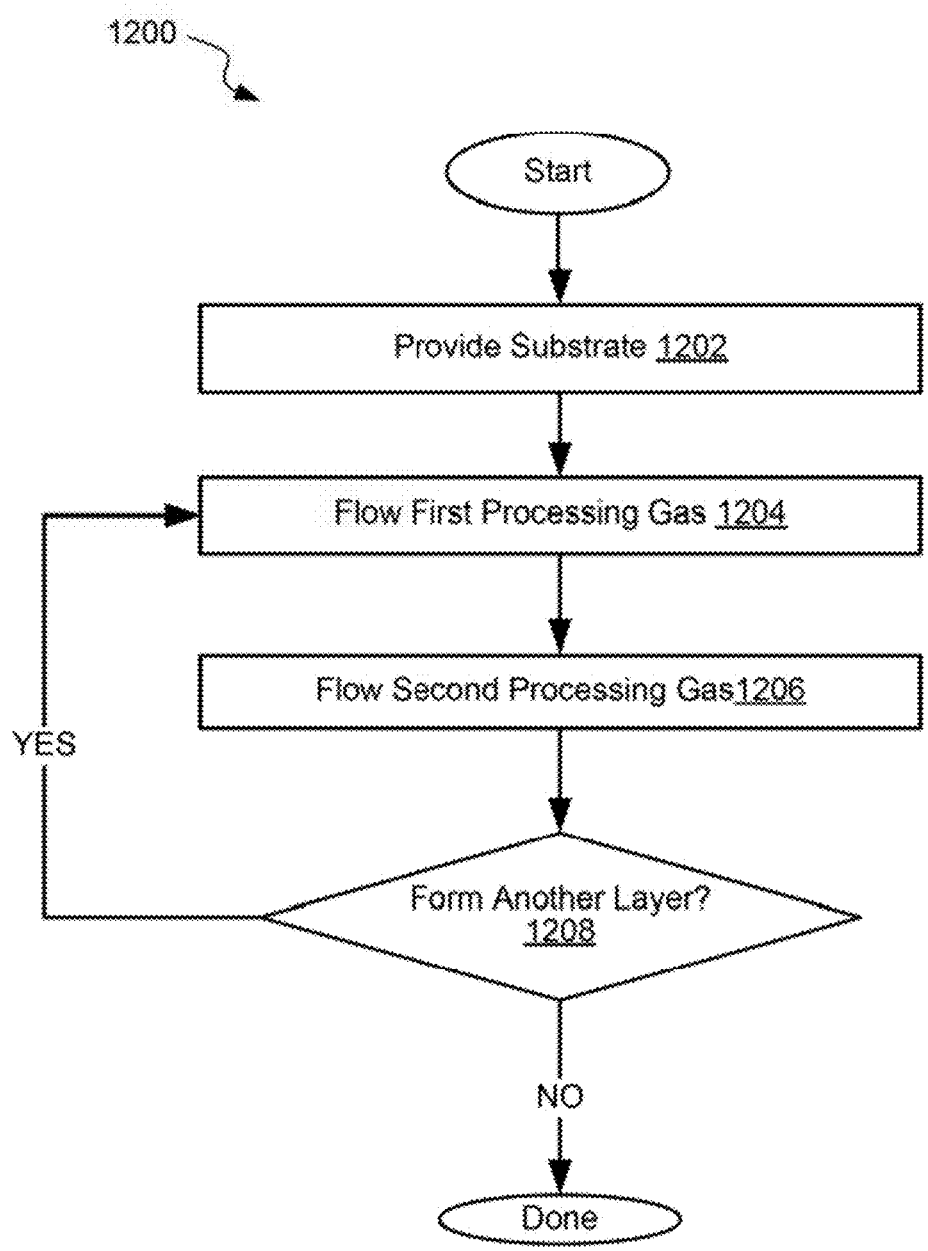
FIG. 12 is a process flowchart corresponding to a method of HPC processing of a semiconductor substrate using a combinatorial showerhead connected to two self-controlled one-way valves, in accordance with some embodiments.

FIG. 12 is a process flowchart of method 1200 of HPC processing of a semiconductor substrate, in accordance with some embodiments. Method 1200 may involve providing the semiconductor substrate into a deposition chamber during operation 1202. Method 1200 may then proceed with flowing a first processing gas into a showerhead provided inside the deposition chamber during operation 1204. The first processing gas flows through a first line and a first self-controlled one-way valve connected to the showerhead. A second self-controlled one-way valve, also connected to the showerhead, blocks the first processing gas from flowing into a second line while the first processing gas flows into the showerhead. In some embodiments, the pressure inside the second line is less than the pressure inside the showerhead when the first processing gas is flowed into the showerhead.

Method 1200 may also proceed with flowing a second processing gas into the showerhead inside the deposition chamber during operation 1206. The second processing gas flows through the second line and the second self-controlled one way valve. The first self-controlled one-way valve blocks the second processing gas from entering into the first line. In some embodiments, the pressure inside the first line is less than a pressure inside the showerhead when the second processing gas is flowed into the showerhead.

In some embodiments, the first processing gas includes a metal precursor. The second processing gas may include an oxidation reagent or a nitridation reagent. The metal precursor is configured to react with the oxidation reagent or the nitridation reagent while in the deposition chamber, for example, in accordance with atomic layer deposition techniques. In some embodiments, the first self-controlled one-way valve and the second self-controlled one-way valve are at a temperature of between about 200° C. and 500° C. during the processing of the semiconductor substrate.

Operations 1204 and 1206 may be repeated one or more times as reflected by decision block 1208.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of high productivity combinatorial (HPC) processing of a semiconductor substrate, the method comprising:
   providing the semiconductor substrate into a deposition chamber; and
   flowing a first processing gas into a showerhead provided inside the deposition chamber,
      wherein the first processing gas is flowed through a first line and a first pressure-controlled one-way valve disposed inside the deposition chamber and connected directly to the showerhead such that the first pressure-controlled one-way valve is disposed between the first line and the showerhead,
      wherein one or more first external valves are disposed outside the deposition chamber, connected to the first line, and control a pressure inside the first line thereby controlling operation of the first pressure-controlled one-way valve,
      wherein a second pressure-controlled one-way valve blocks the first processing gas from flowing into a second line while the first processing gas flows into the showerhead,
      wherein the second pressure-controlled one-way valve is disposed inside the deposition chamber and connected directly to the showerhead such that the second pressure-controlled one-way valve is disposed between the second line and the showerhead, and
      wherein one or more second external valves are disposed outside the deposition chamber, connected to the second line, and control a pressure inside the second line thereby controlling operation of the second pressure-controlled one-way valve.

2. The method of claim 1, wherein the pressure inside the second line is less than a pressure inside the showerhead while the first processing gas flows into the showerhead.

3. The method of claim 1, further comprising flowing a second processing gas into the showerhead in the deposition chamber, wherein the second processing gas flows through the second line and the second pressure-controlled one-way valve, and wherein the first pressure-controlled one-way valve blocks the second processing gas from entering into the first line.

4. The method of claim 3, wherein the pressure inside the first line is less than a pressure inside the showerhead while the second processing gas flows into the showerhead.

5. The method of claim 3, wherein the first processing gas comprises a metal precursor, and wherein the second processing gas comprises an oxidation reagent or a nitridation reagent.

6. The method of claim 1, wherein the first pressure-controlled one-way valve and the second pressure-controlled one-way valve are at a temperature of between about 200° C. and 500° C. during the processing of the semiconductor substrate.

7. The method of claim 1, wherein the first pressure-controlled one-way valve is a check valve.

8. The method of claim 7, wherein the second pressure-controlled one-way valve is a check valve.

9. The method of claim 1, wherein the first pressure-controlled one-way valve controls the flow of the first processing gas from the first line into the showerhead based on a pressure differential between the first line and the showerhead.

10. The method of claim 1, wherein the second pressure-controlled one-way valve controls the flow of the second processing gas from the second line into the showerhead based on a pressure differential between the second line and the showerhead.

11. The method of claim 1, wherein the one or more first external valves are communicatively coupled to a system controller, wherein the system controller controls the pressure in the first line through the one or more first external valves.

12. The method of claim 1, wherein the showerhead comprises multiple isolated compartments for performing HPC processing of a semiconductor substrate.

13. The method of claim 12, wherein the first processing gas is flowed into a first isolated compartment of the multiple isolated compartments, and wherein the second pressure-controlled one-way valve blocks the first processing gas from flowing into the second line from the first isolated compartment.

14. The method of claim 13, wherein the multiple isolated compartments further comprise a second isolated compartment and wherein the second isolated compartment is coupled to an additional pressure-controlled one-way valve.

15. The method of claim 1, wherein both the first pressure-controlled one-way valve and the second pressure-controlled one-way valve are directly connected to the first isolated compartment of the showerhead.

16. The method of claim 1, wherein the one or more first external valves comprise multiple valves controlling flow of multiple reactants and a purge gas into the first line.

17. The method of claim 1, wherein an interior temperature of the deposition chamber is between 200° C. and 400° C.

18. The method of claim 1, wherein a pressure differential between the first line and the deposition chamber is greater than a pressure differential between the second line and the deposition chamber is greater while the second pressure-controlled one-way valve blocks the first processing gas from flowing into a second line while the first processing gas flows into the showerhead.

* * * * *